US010804428B2

(12) United States Patent
Li et al.

(10) Patent No.: US 10,804,428 B2
(45) Date of Patent: Oct. 13, 2020

(54) HIGH EFFICIENCY LIGHT EMITTING DIODE (LED) WITH LOW INJECTION CURRENT

(71) Applicant: International Business Machines Corporation, Armonk, NY (US)

(72) Inventors: Ning Li, White Plains, NY (US); Kevin Han, Berkeley, CA (US); Devendra K Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/194,177

(22) Filed: Nov. 16, 2018

(65) Prior Publication Data

US 2020/0161501 A1 May 21, 2020

(51) Int. Cl.
*H01L 33/06* (2010.01)
*H01L 33/00* (2010.01)
*H01L 33/08* (2010.01)
*C30B 25/02* (2006.01)
*H01L 33/14* (2010.01)
*H01L 33/30* (2010.01)
*H01L 33/10* (2010.01)

(52) U.S. Cl.
CPC ............. *H01L 33/06* (2013.01); *C30B 25/02* (2013.01); *H01L 33/0066* (2013.01); *H01L 33/08* (2013.01); *H01L 33/10* (2013.01); *H01L 33/14* (2013.01); *H01L 33/30* (2013.01)

(58) Field of Classification Search
CPC ......... H01L 33/06; H01L 33/08; H01L 33/10; H01L 33/30; H01L 33/0066; H01L 33/14; C30B 25/02
See application file for complete search history.

(56) References Cited

U.S. PATENT DOCUMENTS

| 3,868,523 | A | 2/1975 | Klopfer et al. |
| 5,684,309 | A | 11/1997 | McIntosh et al. |
| 5,917,201 | A | 6/1999 | Ming-Jiunn et al. |
| 6,878,970 | B2 | 4/2005 | Bour et al. |
| 7,198,972 | B2 | 4/2007 | Sato |
| 8,837,547 | B2 | 9/2014 | Johnson et al. |
| 10,043,941 | B1 * | 8/2018 | Li ........................ H01L 33/06 |

(Continued)

OTHER PUBLICATIONS

Guo, Yanqing et al. Efficiency enhancement for SiN-based light emitting device through introduction of Si nanocones in emitting layer, Opitical Society of America, 2015.

(Continued)

*Primary Examiner* — Selim U Ahmed
(74) *Attorney, Agent, or Firm* — Daniel P. Morris; Lou Percello, Attorney, PLLC (57) ABSTRACT

The present invention is a small, highly efficient, Low Power-Light Emitting Diode (LP-LED) that operates at low power, currents, and voltages. The LP-LED has a first and second cladding layer with a narrow emissions layer disposed between. A valence quantum well and a conduction quantum well form within the emissions layer. Materials are chosen so that either the valence quantum well or the conduction quantum well has a potential depth much larger than the other quantum well. In some preferred embodiments, the cladding material is chosen to have a low non-radiative recombination rate.

18 Claims, 6 Drawing Sheets

(56) References Cited

U.S. PATENT DOCUMENTS

2007/0297729 A1* 12/2007 Kodama ................ G02B 6/42
                                                    385/94
2009/0168634 A1    7/2009 Isshiki
2011/0204328 A1    8/2011 Tansu et al.
2015/0290473 A1* 10/2015 Abdul-Hamid ...... A61N 5/1049
                                                    600/1

OTHER PUBLICATIONS

Romer, Friedhard and Witzigmann, Bernd, Effect of Auger recombination and leakage on the droop in InGaN/GaN quantum well LEDs, Computational Electronics and Phontonics Group, Dept. of Electrical Engineering, University of Kassel, Optical Society of America, 2014.

Herber, J.D., et al., Multiple subband transitions and evidence for population inversion in InAs/In(As, Sb) heterostructures, American Institute of Physics, 2002.

* cited by examiner

HIGH EFFICIENCY LIGHT EMITTING DIODE (LED) WITH LOW INJECTION CURRENT

BACKGROUND

The present invention relates to Light Emitting Diodes (LEDs), and more specifically, to high efficiency LEDs with low injection current.

Successful and ubiquitous implementation of Internet of Things (IoT) will require a multitude of smart devices transmitting, receiving, and processing data from a variety of spatially distributed, untethered sensors, i.e. sensors not connected to an external power source. These sensors, capable of communication with other sensors (or nodes or motes) in a network, have wide-ranging applications in health care, environmental monitoring, agriculture, manufacturing, tracking and authentication, and more. Miniaturization of such IoT devices to the size of a dust mote is possible due to remarkable advancements in CMOS technology and micro-packaging. This miniaturization allows system level integration of energy harvesting devices, information processing microprocessors and memories, and wireless communication devices, all within a small footprint.

Miniaturization also enables dramatic reduction in cost. A 300 mm Si wafer can easily accommodate over 100,000 advanced ICs with a footprint of <0.8 mm×0.8 mm, where each is expected to have approximately 100 million transistors using the latest 10 nm technology. This capability enables sufficient edge computing capability for many applications.

However, as the footprint of IoT devices shrinks, the device ability to harvest and capacity to store energy shrinks quadratically. Transmitting and receiving data in power and size constrained IoT systems is highly challenging using traditional Radio Frequency (RF) and optical devices. RF transmitters consume power in the mW range and become extremely inefficient if scaled to sub-centimeter dimensions. Optical devices can be scaled to smaller dimensions while maintaining their efficiency to achieve orders of magnitude size and energy reduction, but the power consumption of existing devices is still high. Lasers have a threshold current requirement, which is about 1 mA for low threshold vertical cavity surface emitting lasers (VCSELs.) However, even the best reported nanolasers require tens to hundreds of micro-Amp threshold current, have low output power, and require sophisticated processing steps.

On the other hand, while LEDs do not have a threshold requirement, which is crucial to reducing power consumption, today's LEDs for lighting and communication show peak efficiency at relatively high currents—exceeding mA with current densities of approximately 1 to 10 A/cm2.

While most LED research work has focused on reducing the efficiency droop at high injection current, comparatively little work has been done on improving LED efficiency at injection current below a few hundreds of a micro-Ampere, e.g. in the mA/cm2 range, where quantum efficiency drops dramatically due to the dominance of non-radiative carrier recombination. As a result, there is a need for LEDs with high efficiencies at low current and/or wattage (microwatt range.) In addition, there is a need for LEDs that operate with high efficiencies in these ranges that are sized smaller than a few hundred microns, particularly for RF or optical wireless communication solutions.

SUMMARY

Embodiments of the present invention are a Low Power-Light Emitting Diode (LP-LED) that operate at low power, currents, and/or voltages, are small in size, and high in efficiency.

The LP-LED has a first and second cladding layer. Each cladding layer has a cladding valence band energy and a cladding conduction band energy. There is a narrow emission layer disposed between the first and second cladding layer forming a valence quantum well and a conduction quantum well within the emissions layer. The emission layer has an emission layer valence band energy and an emission conduction band energy. The valence quantum well has a valence energy difference equal to the difference between the cladding valence band energy and the emission valence band energy. The conduction quantum well has a conduction energy difference being the difference between the cladding conduction band energy and the emission conduction band energy. Materials for the cladding layers and emission layer are chosen so that either the valence quantum well or the conduction quantum well has a potential depth much larger than the other quantum well. In some preferred embodiments, the cladding material is chosen to have a low non-radiative recombination rate.

Alternative apparatus, devices methods of making, and methods of use are disclosed.

BRIEF DESCRIPTION OF THE DRAWINGS

The subject matter of embodiments of the present invention is particularly pointed out and distinctly defined in the claims at the conclusion of this specification. The foregoing and other features and advantages are apparent from the following detailed description taken in conjunction with the accompanying drawings in which include:

DETAILED DESCRIPTION

Various embodiments of the present invention are described herein with reference to the related drawings. Given this disclosure, alternative embodiments can be devised without departing from the scope of this invention.

It is noted that various connections and positional relationships (e.g., over, below, adjacent, etc.) may be set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that given this disclosure one skilled in the art would be able to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, unless otherwise stated, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. Where various steps in the manufacture of semiconductor devices and semiconductor-based ICs are well known, in the interest of brevity, many conventional steps will only be mentioned briefly herein or will be omitted entirely without providing the well-known process details.

Although specific fabrication operations used in implementing one or more embodiments of the present invention can be individually known, the described combination of operations and/or the related structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

Depending on the application, various processes used can include, for example, film deposition, and semiconductor doping. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and, atomic layer deposition (ALD) among others. Semiconductor doping is the modification of electrical properties by doping, for example, transistor sources, drains and/or device junctions, generally by diffusion and/or by ion implantation. These doping processes can be followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate layers, junctions, transistors, and/or their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Turning now to a more detailed description of the structures, methods, technologies, operations, and uses that are more specifically relevant to aspects of the present invention.

As noted above, LEDs function by forward biasing a junction of the LED with a voltage that induces an injection current. The injection current flows through the junction and injects holes and electrons into an active region, an emission layer of the LED. Light (or other electromagnetic radiation) emission from the LED is caused by the spontaneous recombination of electrons and holes within the active region. The light generation process is called radiative recombination. The percentage of injected carriers (electrons or holes) that generate photons of light is known as quantum efficiency. For example, "external quantum efficiency" is a measure of the ratio of photons emitted from an LED to carriers injected into the LED.

External Efficiency=$\eta_{ext}$=photons emitted/carriers injected

Other measures of efficiency include internal radiative efficiency, $\eta_{int}$, a ratio between the radiative recombination rate to the total recombination rate.

$\eta_{int}=Bn^2/(An+Bn^2+Cn^3)$, where $\eta_{int}$ is the internal radiative efficiency;

n is the carrier density, i.e. electron density, n, or hole density, p;

A is the non-radiative recombination rate;

B is the radiative recombination rate; and

C is the Auger recombination rate.

Quantum efficiency is related to charge density through the concepts of radiative recombination and non-radiative recombination.

Radiative recombination is the process of an electron combining with a hole causing a photon to radiate.

Radiative recombination is a light (or other electromagnetic energy) generation process that can happen in the LED and is proportional to the square of the carrier density, i.e. defined by the term "$Bn^2$" in the equation for $\eta_{int}$, above. Alternatively, radiative recombination is proportional to product of the carrier density of both electrons, n, and holes, p, respectively, or Bnp.

Radiative recombination of electrons and holes is a process by which both carriers annihilate one another, and electrons occupy (through one or multiple steps) the empty state associated with a hole. Both carriers eventually disappear in the process. The energy difference between the initial and final state of the electron is released in the process as light or other electromagnetic energy.

Non-radiative recombination is a process in semiconductors and in some other materials by which charge carriers, i.e., electrons, n, and holes, p, recombine without releasing photons. A phonon is released instead. Non-radiative recombination in optoelectronics typically is an unwanted process, lowering the light generation efficiency and increasing heat losses.

In semiconductor LED applications, the rate of non-radiative recombination is proportional to the charge density itself, i.e. defined by the term "An" in the equation for $\eta_{int}$, above.

At low injection currents, e.g. a current density below 10 A/cm2 and/or injection currents below about 1 mA, the An term dominates the $Bn^2$ term. Therefore, higher non-regenerative recombination at low current densities and/or injection currents causes low internal radiative efficiency, $\eta_{int}$, at these operating ranges, because these non-regenerative re-combinations are not producing light.

The Auger recombination rate is a process in which an electron and hole recombine in a band-to-band transition, but the resulting energy is given off to another an electron or hole, i.e., a third particle affects the recombination rate. At the low injection currents at which the present invention operates, e.g. a current density below 10 A/cm2 and/or an injection current below about 1 mA, the Auger recombination rate is low and is ignored.

However, even neglecting the Auger recombination rate, as stated, decreasing the injection current decreases charge density. Therefore, operating at a low injection current (e.g., below about 1 mA) causes the charge density to be low, the rate of radiative recombination is not considerably greater than the rate of non-radiative recombination, and the quantum efficiency decreases.

A shortcoming of known, prior art LED configurations is that for many uses they cannot provide sufficient quantum efficiency in low power applications where the injection currents are less than about 1 mA.

To address some of the failings of the prior art, a preferred embodiment of the novel, present Low Power-LED (LP-LED) has a quantum well (QW) in the active region with a unique well/cladding design to significantly increase efficiency including the following mechanisms:

1) a large valence (or conduction—see below) band offset $Q_v=\Delta E_v/(\Delta E_v+\Delta E_c)$ to increase hole (or electron) density at low injection, and 2) a high-quality interface to reduce the interface recombination velocity (IRV).

The large valence band offset can be defined by $Q_v=\Delta E_v/(\Delta E_v+\Delta E_c)$, where a. $Q_v$ is the valence band offset;

b. $\Delta E_v$ is the energy value of the difference between the two valence bands at the interface (141, 161) between the cladding/barrier layer and the emission layer, see below; and c. $\Delta E_c$ is the energy value of the difference between the two conduction bands at the interface (141, 161) between the cladding/barrier layer and the emission layer.

In this preferred embodiment, the valance band offset, $Q_v$, causes the one carrier density to be very much greater than the other carrier density. Specifically, in this non-limiting example, the carrier electron density, n<<p, the carrier hole density.

Under these constraints, neglecting the Auger recombination effects due to low injection current, and recognizing the radiative recombination is proportional to the product of the carrier densities, the internal quantum efficiency relationship becomes:

$\eta_{int}=Bnp/(An+Bnp)=Bp/(A+Bp)$

In some embodiments, at low current density, the hole density p stays at a high value, leading to high radiative rate Bp. Under these constraints it is noted that as the hole carrier density, p, increases in this example, the internal radiative efficiency, $\eta_{int}$, approaches 1.

In preferred embodiments, an interface is selected to reduce the interface recombination velocity (IRV). This improves the internal radiative efficiency, $\eta_{int}$, further by reducing A, the non-radiative recombination rate. That is, the number of non-radiative re-combinations at the quantum well-cladding interface is reduced.

The non-radiative rate at low current can be written as $A=1/\tau_{nr}=1/\tau_s+2v_i/d$, where $\tau_s$ is the effective lifetime of the carriers due to non-radiative recombination in the bulk of the well (150), $v_i$ is the IRV at the well-cladding interface (141, 161), and d is the well width, i.e., the distance between the well-cladding interfaces (141, 161.)

Figure 1:
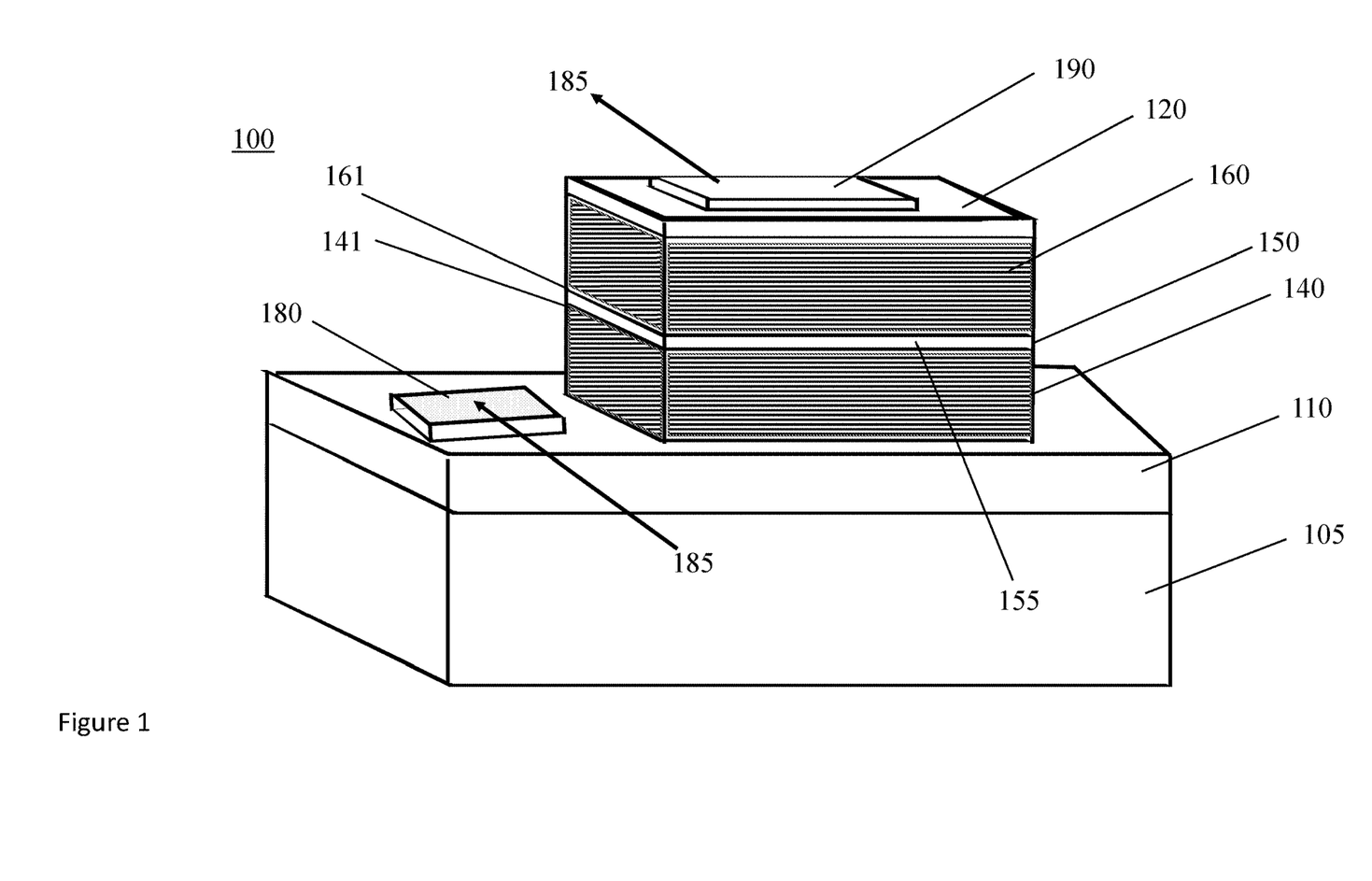
FIG. 1 is a structure diagram of one preferred embodiment of the present invention.

Refer to FIG. 1, a structure diagram of one preferred embodiment 100 of the present Low Power LED invention.

Layer 105 is a semi-insulating substrate that supports the device structure and electrically and physically connects to the bottom of a lower barrier/cladding layer 140 through a bottom contact layer 110. In preferred embodiments, the semi-insulating substrate 105 comprises semiconductor materials such as Si, GaAs, InP, GaN, SiC, and sapphire.

The semi-insulating substrate has thicknesses typically ranging from 1 um to 500 um, however, other thicknesses are envisioned.

In one preferred embodiment, the semi-insulating substrate 105 is made from GaAs. The GaAs substrate 105 has a low free carrier absorption is transparent to the emission wavelength of a preferred quantum well made from InGaAs. This transparency enables backside light outcoupling and flip-chip-bonding on a silicon substrate.

In a preferred embodiment, the bottom contact layer 110 is a conductive material that is physically and electrically directly attached to the top of semi-insulating substrate 105 on a bottom side of the bottom contact layer 110. The top side of the bottom contact layer 110 is physically and electrically directly connected to a bottom side of the bottom barrier/cladding 140 layer. In preferred embodiments, the bottom contact layer 110 comprises one or more of the following materials: Si, Ge, SiGE, and GaAs. Typically, the thickness of the bottom contact layer 110 is between 1 um and 2 um. The bottom contact layer provides a highly conductive region in order to inject current into the LED.

There is a bottom electrical contact 180 that is directly disposed and electrically and physically attached to the top of the bottom contact layer 110. The bottom electrical contact 180 is a metal or other conductive material and provides an electrical connection through the bottom contact layer 110 to the lower cladding/barrier layer 140. Typically, the first electrical contact 180 is made of any one the following: titanium, platinum, gold, germanium, silver, zinc, and aluminum. The thickness of the first electric contact layer 180 is thick enough so there are no heating effects caused by the contact when the injection current runs through it, typically between 1 uA and 1 mA.

The active region of the device 100 comprises the emissions layer 150. In a preferred embodiment, the active region 150 is disposed directly on and is physically and electrically connected to a bottom barrier (or cladding) layer 140. In a preferred embodiment, a top barrier (or cladding layer) 160 is disposed directly on and physically and electrically connected to the top of the emission layer 150.

The top of the bottom cladding layer 140 and the bottom of the top cladding layer 160 form a bottom 141 and top 161 interface with the bottom and top of the emission layer 150, respectively. Each interface (141, 161) of the cladding layers (140, 160) forms a physical, electrical, and quantum cladding interface (141, 161) where the cladding layers (140, 160) interface with the emission layer 150. The well-cladding interfaces (141, 161) form the wall on either side of the emission layer that define transitions in the energy levels in the device 100 that determine the location of the quantum wells. The separation between the interfaces (141, 161) determines the width, d, 155 of the quantum well. In preferred embodiments, the selection of the cladding material (140, 160) with a low interface recombination velocity (IRV) factors into reducing the amount of non-radiative recombination at the interfaces (141, 161.)

Typically, the cladding layers (140, 160) have a thickness between 20 nm and 1000 nm. This makes the cladding layers (140, 160) thin enough to avoid excess electrical resistance but thick enough to confine carriers within the well.

In a preferred embodiment, a top contact layer 120 is disposed directly on the top of the top cladding layer 160 (opposite the side connected to the emission layer 150.) The top contact layer 120 is physically and electrically connected to the top surface of the top cladding layer 160 and enables an electrical connection from a top metal contact 190, through the top contact layer 120 and top cladding layer 160, to the top side of the emissions layer 150.

In preferred embodiments, the top contact layer 120 is made of GaAs. The top contact layer 120 is typically between 30 nm and 1 um in thickness.

In preferred embodiments, the top metal contact 190 is made of any metallic or conductive material such as titanium, platinum. gold, germanium, silver, zinc, and aluminum. The thickness of the top electric contact layer 190 is thick enough so there are no heating effects caused by the contact when the injection current runs through it, typically between 1 uA and 1 mA.

An external voltage source applied across the top 190 and bottom 180 contacts to forward bias the device 100 and causes an injection current 185 to flow through the device 100.

The top cladding (barrier) layer 160 is doped with a first carrier dopant and the bottom cladding (barrier) layer 140 is doped with a second carrier dopant. The carrier dopants are either "p-type" or "n-type."

The term "p-type" refers to the addition of impurities to an intrinsic semiconductor that create deficiencies of valence electrons. Examples of p-type dopants include boron, aluminum, gallium and indium. The term "n-type" refers to the addition of impurities that contributes free electrons to an intrinsic semiconductor. Examples of n-type dopants include antimony, arsenic and phosphorous.

The doping can be achieved using "in-situ" doping during epitaxial growth of the semiconductor materials that form the respective semiconductor layer, or doping can be achieved by utilizing ion implantation or gas phase doping.

One of the cladding layers (140, 160) will be p-doped and the other cladding layer will be n-doped. In some embodiments, the p-type doped region can be about 30 nm to about 200 nm thick and the n-type doped region can be about 30 nm to about 200 nm thick.

The emission layer 150 is "sandwiched" between the bottom 140 and top 160 doped cladding/barrier layers (140, 160) at the respective interfaces (141, 161).

In some preferred embodiments, the emission layer 150 is undoped. In these instances, the two cladding layers (140, 160) with the emission layer 150 between can be viewed to form a "PIN" junction.

By minimizing doping in the emission layer 150, non-radiative emissions are reduced due to imperfections in the lattice structure of the emission layer 150.

The crystal structures, e.g. the lattice constants, of the cladding (140, 160) and emission 150 layers are considered during material selection. Materials with identical or similar lattice constants will have fewer internal flaws or dislocations, less internal stress, and easier methods of manufacturing.

This type of crystal structure compatibility may be considered for selection of the other layers in the device 100 as well. However, these considerations have to be balanced against material characteristics that enable the quantum and re-combinative constraints described below.

The emission layer 150 has a thickness, d, 155. In preferred embodiments, the emission layer 150 thickness, d, is between 7 to 10 nanometers. The small thickness 155 of the emission layer 150 causes the formation of quantum wells (QW.) The width of the QW is defined as within the emission layer 150 and the QW is bound by the interfaces (141, 161.)

The narrower the well thickness 155, the more energy levels are in the QWs, and the higher the frequency of light (electromagnetic energy) emitted from the emission layer 150. The wider 155 the QW, the fewer the energy levels in the QW, and the lower the frequency of light (electromagnetic energy) emitted from the QW. Selection of the QW thickness/width 155 depends on the frequency of the emitted light and should be thick enough to ensure at least one energy level in the QW.

In a preferred embodiment, the emission layer 150 is made of InGaAs. In alternative embodiments, the emission layer 150 is made of GaAs.

Within the emission layer 150, e.g. within the device 100 interfaces (141, 161), a quantum well (QW) forms each in the conduction band and in the valence band. The "width," d, of these two QWs equals the thickness of the emission layer 150, e.g. between 7 to 10 nm. These two QW will be opposite one another within the width of the emission layer 150.

The height, or depth, of each of these wells depends on the selection of materials for both the emission layer 150 and cladding (140, 160.) For example, if there is a large "offset," or difference between the energy levels of the valance bands between the materials in the cladding (140, 160) and the emission layer 150, the QW on the valance side will be deep. Alternatively, if there is a large "offset," or difference between the energy levels of the conduction bands between the materials in the cladding (140, 160) and the emission layer 150, the QW on the conduction side will be deep. In similar manner, if there is a small "offset," or difference between the energy levels of the valance (conduction) bands between the materials in the cladding (140, 160) and the emission layer 150, the QW on the valance (conduction) side will be shallow. Also note that, for material choices that have a constant band gap, having a deep well on the valence (conduction) side would indicate that the well on the conduction (valence) side would be shallow.

In preferred embodiments of the present invention, materials for the cladding (140, 160) and emission layer 150 are chosen so one QW is deep. In other preferred embodiments, materials are chosen so one QW is deep and the opposite QW is shallow.

The novel structure improves device 100 efficiency at low injection current by: i. trapping a large concentration of carriers in the deep QW to create a high concentration of these carriers within the deep QW location; trapping relatively few opposite carriers in the opposite, e.g. shallow well, so as not to require high levels of current flow; and iii. allowing the opposite carriers in the shallow well easily to radiatively recombine with the carriers in the deep QW in a highly efficient manner because of the localized carrier density.

Referring to the discussion above about internal radiative efficiency, quit, (where the Auger recombination, "C," is neglected for small currents), the internal radiative efficiency approaches 1, as the carrier density (in this example the carriers are electrons) increases:

$$\eta_{int} = Bn^2/(An+Bn^2)$$

To further increase the internal radiative efficiency, the non-radiative recombination, A, is reduced by selection of the cladding (140, 160) material.

As we know, $$A = 1/\tau_{nr} = 1/\tau_s + 2v_i/d, \text{ where}$$

$\tau_s$ is the effective lifetime of the carriers due to non-radiative recombination in the bulk of the well (150),
$v_i$ is the IRV at the well-cladding interface (141, 161), and
d is the well width, i.e., the distance between the well-cladding interfaces (141, 161.)

By picking cladding material with a low interface recombination velocity (IRV) we can further improve efficiency.

Note that in alternative embodiments, the materials of the lower 140 and upper 160 barrier/cladding layers can be different. However, in preferred embodiments, the valence band offset still needs to be maintained.

Figure 2:
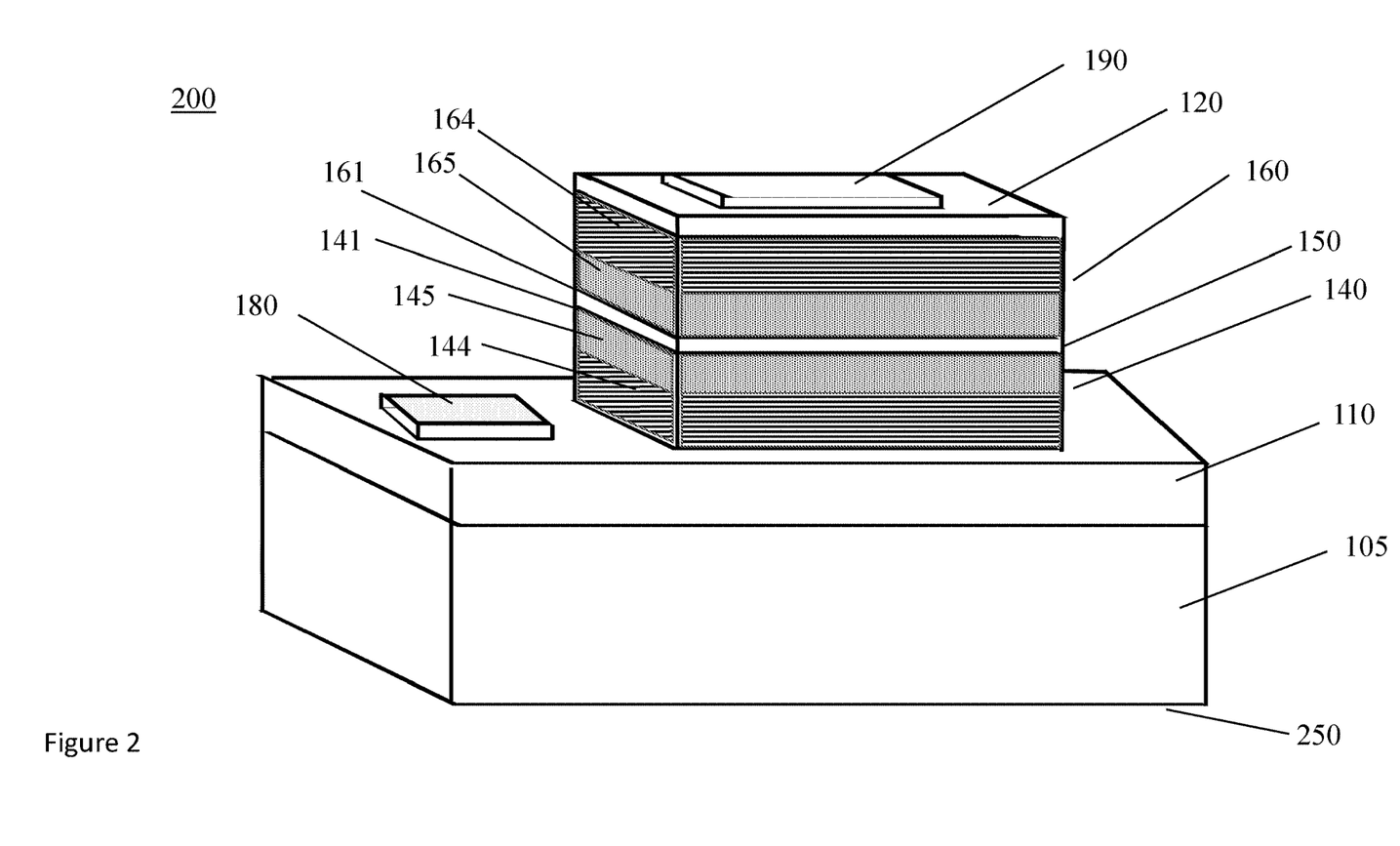
FIG. 2 is a structure diagram of one preferred alternative embodiment of the present invention.

Briefly refer to FIG. 2, a structure diagram of one preferred alternative embodiment 200 of the present invention.

In the structure 200, each of the cladding/barrier regions (140, 160) is broken into a doped and an undoped cladding region. The undoped region (145, 165) of the cladding/barrier layer (140, 160) share the interface (141, 161), respectively, with the emission layer 150. The doped regions (144, 164) of the cladding/barrier layer (140, 160), respective are doped with opposite carriers. For example, doped region 144 would be doped with p type carriers while region 164 would be doped with n type carriers. This embodiment increases the injections of electrons from one side of the device 200 and holes from the other. The doping of the cladding should be high enough ($\sim 10^{17}$-$10^{18}$ cm$^{-3}$) to supply carriers to the active region.

Preferred embodiments of the present invention can be very small. Surface area (cross sectional area) 250 of the LP-LED can be on the order of $3 \times 10^{-7}$ to $3 \times 10^{-9}$ m$^2$, e.g. 960-60 µm in diameter, or less. These devices (100, 200) have high efficiency at low injection current 185, e.g. on the order of 1 µA to 100 µA, corresponding to a current density of ~0.1 A/cm2 to 10 A/cm2.

As discussed above, $\eta_{int}$, the internal radiative efficiency, can be close to 100% at 1 µA. Our largest device (960 um diameter) still shows ~50% $\eta_{int}$ at ultralow current densities ~$2 \times 10^{-7}$ A/cm$^2$ with near-unity $\eta_{int}$ at ~$10^{-4}$ A/cm$^2$.

The external radiative efficiency may be limited to ~2 to 7% by the light trapping in the substrate due to a higher refractive index (>1) of the substrate relative to air.

In one preferred embodiment, the device is an InGaAs/InGaP strained quantum well structure (100, 200.) In this embodiment, InGaAs was chosen for the emission layer 150 and InGaP was chosen for the cladding (140, 160) largely because of the large valence band offset of InGaAs/InGaP materials. Note that GaAs can also be used as the emissions layer 150 for the same valence band offset reasons. In addition, not only is the cladding InGaP an excellent passivation layer for GaAs, but also InGaP has a low interface recombination velocity (IRV), predicted as under 1.5 cm/seconds.

Specifically, in this example embodiment, an In0.18Ga0.82As quantum well (emission layer 150) is sandwiched between In0.49Ga0.51P cladding layers (140, 160) on both sides. The structures were grown by the metal organic chemical vapor deposition (MOCVD) method on a semi-insulating GaAs substrate 105. The semi-insulating GaAs substrate with low free carrier absorption is transparent to the emission wavelength of the InGaAs quantum well, enabling backside light outcoupling and flip-chip-bonding on a silicon substrate. In this embodiment, the materials chosen created a deep QW in the valence band and a relatively shallower QW in the conduction band.

Figure 3:
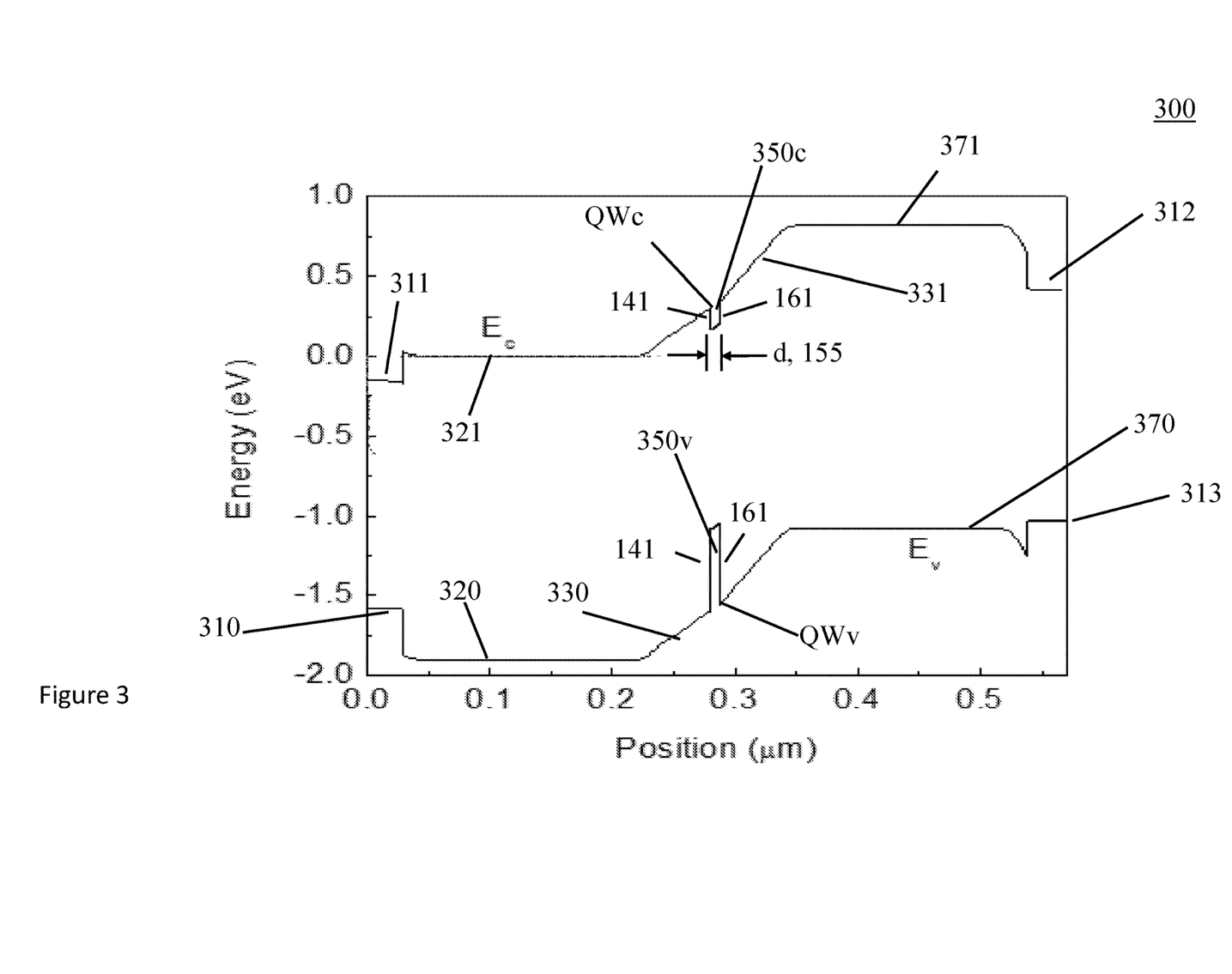
FIG. 3 is an energy level diagram showing example, simulated energy levels of the present LED invention where there is a deep quantum well for one current carrier in the LED and a relatively shallow quantum well for the other current carrier in the LED.

Referring to FIG. 3, an energy level diagram 300 showing example, simulated energy levels of the present LED invention (100, 200) where there is a deep quantum well QWv for one current carrier in the LED and a relatively shallow quantum well QWc for the other current carrier in the LED.

The x-axis measures the distanced (in µm's) traversed through the device (e.g., 200) from one electrical contact, e.g. 180, to the opposite contact, e.g. 190. The y-axis is a simulation of the energy (in electron volts –eV) at each location in the device at both the valence and conduction bands.

Traversing the FIG. 3 from left to right, there is an energy level (310, 311) associated with a contact voltage on both the valance 310 and conduction 311 bands. Moving from position (about) 0.04-0.23 µm, there is a flat region (320, 321) in both the valence 320 and conduction 321 bands. These "flat"

regions represent conductive and/or doped materials where the energy level does not change because there is no significant electric field.

Between about position 0.23 and 0.34 μm there is a sloping region in both the valance 330 and conduction 331 bands indicating a change in energy as an electric field region is traversed. Since in structure 100, both cladding layers (140, 160) are entirely doped, the regions with an electric field (330, 331) only exist within the undoped emissions layer 150, show in FIG. 3 as in the location of the QWv and QWc. However, in the structure 200, since part (145, 165) of the cladding (140, 160) is undoped (145, 165), the respective regions (330, 331) begin/end at the locations in the cladding (140, 160) where the doped regions (144, 154) transition to no doped regions (145, 165) where an electric field exists.

The emissions layer 150 is bounded by interfaces 141 and 161 and has a width, d 155. Both quantum wells, QWv and QWc, are in the same location, at the emission layer 150 within the interfaces (141, 161.) In this non-limiting example, the materials were chosen to have a large difference in valence band energy so the QWv in the valance band has a deep well 350v. These chosen materials defined a small energy difference in the conduction band and therefore there is a shallow depth 350c in QWc.

In the positions between (about) 0.34-0.53 μm, there is another flat region (370, 371) in both the valence 370 and conduction 371 bands. These "flat" regions represent conductive and/or doped materials where the energy level does not change because there is no significant electric field. Opposite potential is applied at the external connections and connected conductive layers (312, 313.)

In a preferred embodiment, the depth of QWc 350c ranges between 0.1 eV and 0.2 eV and the depth of QWv 350v ranges between 0.5 and 0.6 eV.

Note that selection of different materials for the cladding (140, 160) and emission layer 150, determines how deep or shallow the QW's are created.

Figure 4:
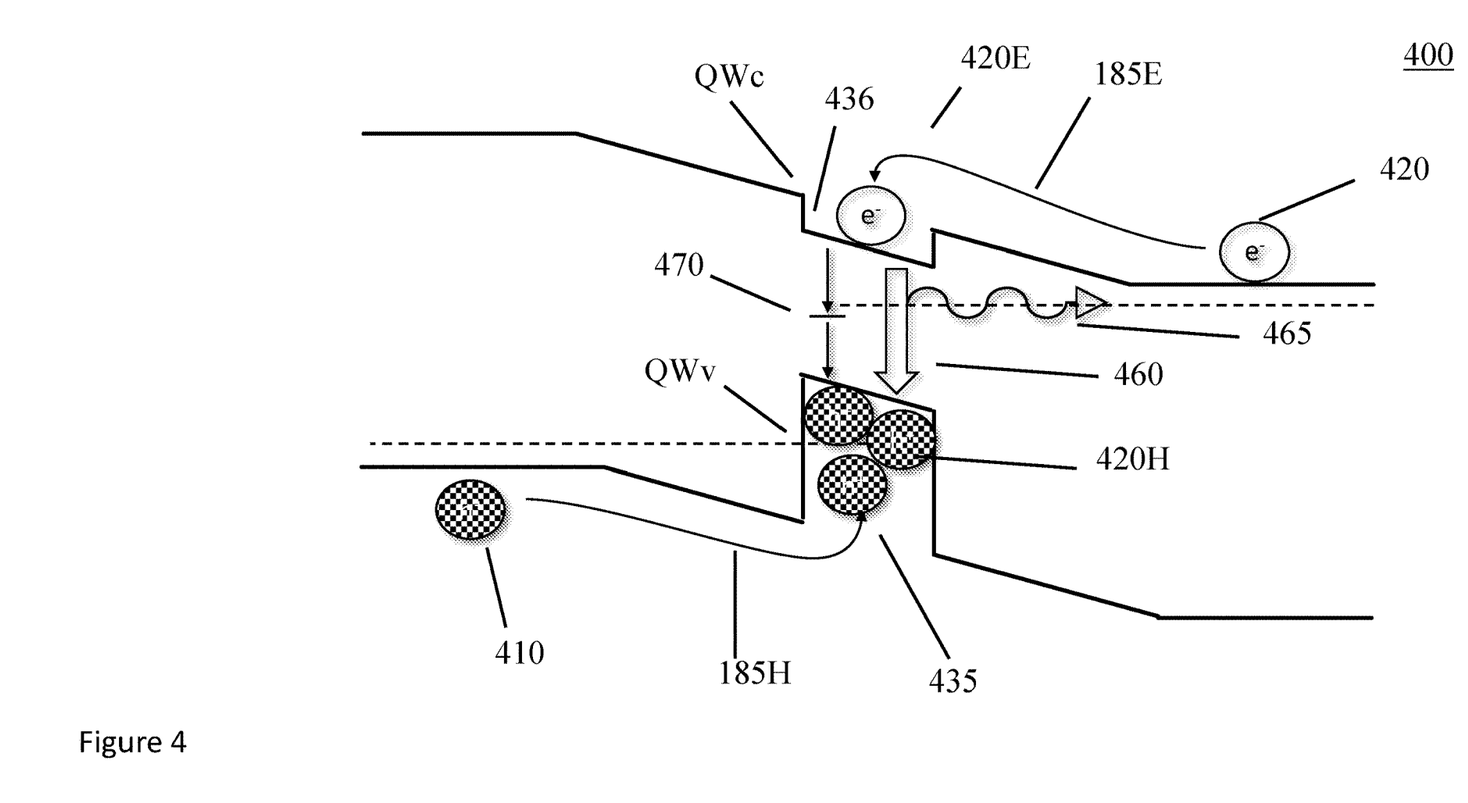
FIG. 4 is an illustration of a high carrier concentration in a deep quantum well during device operation.

Referring to FIG. 4, an energy level 400 illustration of a high carrier concentration in the deep 435 quantum well, QWv, during device operation. The energy level 400 is similar in features to the energy level diagram 300 but the device is biased in the opposite direction. The bias voltage induces the injection current 185 by moving both the holes carriers 410 in a hole current 185H and the electron carriers 420 in an electron current 185E. This combined injection current 185 is very low, being in the range of 1 μA to 1 mA.

The energy level 400 illustration is a non-limiting example showing how the presentation invention uses a deep 435 QWv to increase the density 420H of one carrier, in this instance holes 410, and store relatively small densities 420E of the opposite carrier, in this instance electrons 420 in a shallow 436 QWc.

Even though the injection current 185 is low, the carrier (in this example 410) attracted to the deeper 435 QW accumulates in the deeper 435 QW and increases in density 420H. The other carrier (in this example 420) does not accumulate as densely in the shallow 436 QW and can more easily radiatively recombine from the barrier in the QW in which it is captured.

Because of the shallowness 436 of the QWc and the proximity of the two wells, QWv and QWc, the carrier 420 in the shallow 136 QW can radiatively combine 460 with the other densely confined carriers 410 to produce a photon 465.

Other non-radiative re-combinations 470 are possible. However, since the cladding layers (140, 160) were chosen with low IRV, the decay time, $\tau_{nr}$, is large and the non-radiative re-combinations are reduced. The number of non-radiative re-combinations is inversely proportional to $\tau_{nr}$.

On the other hand, the radiative re-combinations 460, inversely proportional to $\tau_r$, increases because $$1/\tau_r = Bp$$

Where "p" is the density of carrier captured in deep 135 QW and "p" is high.

In preferred embodiments, here are two preferred material selection criteria:

Qc<~0.25 and $m_e/m_h$<~0.1, $m_e$ is the electron effective mass in the conduction band of the emission layer, $m_h$ is the hole effective mass in the valence band. In this case, there is very low electron density and high hole density in the quantum well at low injection current; or Qv<~0.25 and $m_h/m_e$<~0.1, $m_e$ is the electron effective mass in the conduction band of the emission layer, $m_h$ is the hole effective mass in the valence band. In this case, there is very low hole density and high electron density in the quantum well at low injection current.

Figure 5:
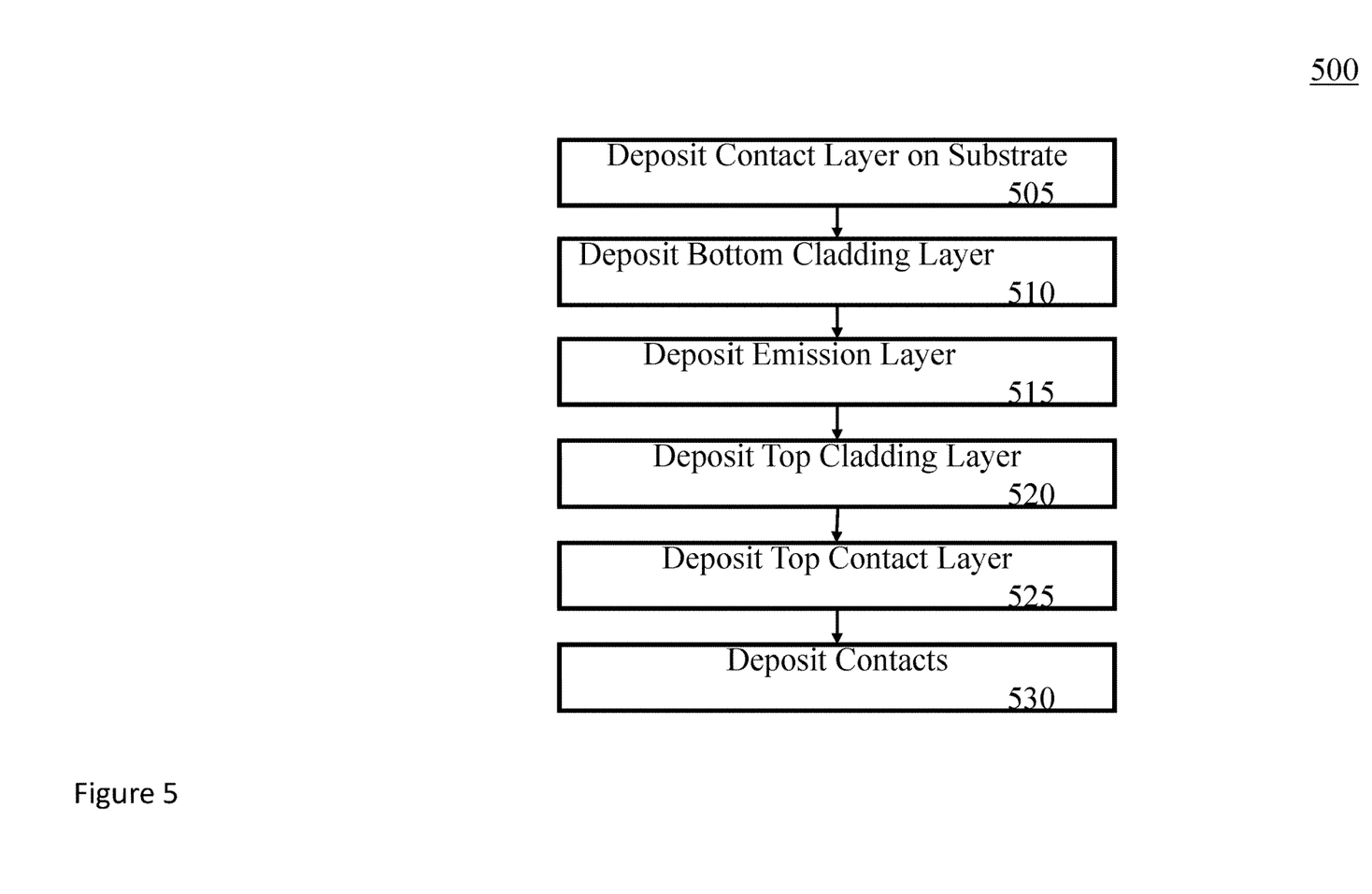
FIG. 5 is a flow chart of one preferred method of making the present invention.

Referring now to FIG. 5, a flow chart of a process 500 of one preferred method of making the present invention.

The process 500 begins with the step of depositing 505 a bottom contact layer 110 on a substrate 105. Preferred materials for the contact layer 110 include: titanium, platinum, gold, germanium, silver, zinc, and aluminum. The contact layer is doped during epitaxial growth to 1E18 cm$^{-3}$ to 1E19 cm$^{-3}$.

The contact layer is masked in an area for the next steps so that a bottom contact 180 can be deposited on the bottom contact layer 110 in a later step.

A bottom cladding layer 140 is deposited 510 on the bottom contact layer 110. In a preferred embodiment, the bottom cladding layer 140 is made of $In_{0.5}Ga_{0.5}P$ and deposited by a time-controlled Metal-Organic Chemical Vapor Deposition (MOCVD) to a 250 nm thickness.

An emission layer 150 is then deposited 515 on the bottom cladding layer 140. In a preferred embodiment, the emission layer 150 is made of $In_{0.2}Ga_{0.8}As$. In alternative embodiments, the emissions layer 150 is made of GaAs.

The preferred thickness of the emission layer 150 is maintained between 7 to 10 nm. In preferred embodiments, the emissions layer is deposited with a time controlled MOCVD.

A top cladding layer 160 is then deposited 520 on the emissions layer 150. In a preferred embodiment, the top cladding layer 140 is made of $In_{0.5}Ga_{0.5}P$. In a preferred embodiment, the top cladding layer 160 is deposited in the same manner as and at about the same thickness as the bottom cladding layer 140.

A top conductive layer 120 is then deposited 525 on the top cladding layer 160. The top contact layer 120 is 30 nm thick GaAs grown by MOCVD.

Then a bottom metal contact 180 is deposited on 530 the bottom contact layer 110 and a top metal contact 190 is deposited on 530 the top conductive layer 120.

In one preferred embodiment, the semiconductor layers including the bottom contact layer 110, the bottom cladding 140, the emissions layer 150, the top cladding layer 160, the top contact layer 120, and the top 180 and bottom 190 metal contacts are grown epitaxially. In other preferred embodiments, the layers are grown by Metal Oxide Chemical Vapor Deposition (MOCVD.)

Semiconductor materials can be epitaxially grown from gaseous or liquid precursors. Epitaxially grown materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of device being formed.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on a semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 6:
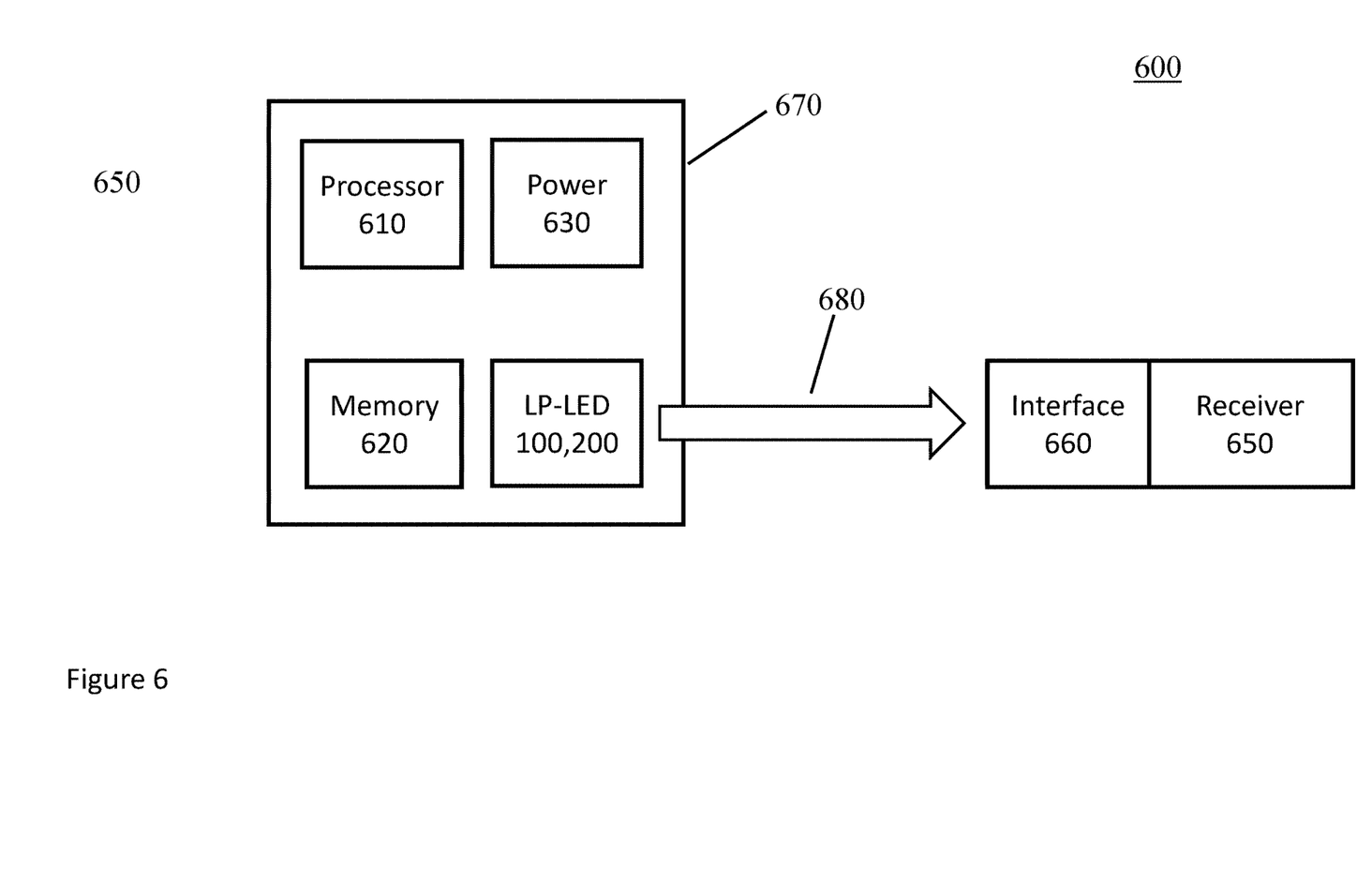
FIG. 6 is a block diagram showing some example uses of the present invention.

FIG. 6 is a block diagram 600 showing some example uses of the present invention.

The LP-LED (100, 200) is shown integrated with other components into an optical communication device 600. The device 600 includes the LP-LED (100, 200), one or more processors 610, one or more memories 620, and one or more power devices, e.g. batteries, external power connections, and/or energy harvesting devices 630.

In preferred embodiments, the LP-LED operates at ultra-low injection current and voltage. Some preferred embodiments of this invention have uses for small footprint, low cost devices in IoT systems. Because of the high efficiency and low power usage of the LP-LED (100, 200), small modules 670 can be untethered, e.g. not connected to any power source, and can function with harvested energy 630, e.g. by coupling with electromagnetic sources in the location of the module 670.

Typically, the LP-LED transmits one or more waves of electromagnetic energy 680, e.g. light to one or more receivers 650 through a medium and/or interface 660. In some embodiments, the wave 680 is encoded by information stored in the memory 620 and encoded, e.g. by turning the injection current 185 on and off, by the processor 610.

In preferred embodiments, the receiver 650 capable of receiving, processing, and decoding the wave 680. The interface can include any optical interface 660 and/or any medium of transmission 660 such as free air transmission, fiber optics, etc.

The LP-LED (100, 200) achieves close to unity internal quantum efficiency at a low injection current of less 1 mA, more preferably less than 0.1 µA (e.g. $10^{-4}$ A/cm2). The LP-LED operates at a low injection current, approximately 3 orders of magnitude lower than conventional LEDs, and at a voltage of approximately 30% below the photon-voltage, hv/q.

The LP-LED can be used in any one or more of the following devices: an optical communication device, a mote in the Internet of Things (IoT), a sensor, a device with no external power connection, a neuromorphic optical network with low power consumption, an optogenetic device that needs to reduce heating for surrounding tissues, and/or any other device where an LED can be used, particularly in cases where low power is required. The LP-LED can communicate with a bit error rate below 1E-6 while operating below 100 µWatt within a communication distance of 5 cm.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:
1. A light emitting diode (LED) comprising:
a first cladding layer, the first cladding layer made of $In_{0.49}Ga_{0.51}P$, the first cladding layer being between 100 nm and 300 nm thick;
a second cladding layer, the second cladding layer made of $In_{0.49}Ga_{0.51}P$, the second cladding layer being between 100 nm and 300 nm thick, the first and second cladding layer each having a cladding valence band energy and a cladding conduction band energy;
an emission layer, the emission layer having an emission layer valence band energy and an emission conduction band energy, the emission layer disposed between the first and second cladding layer forming a valence quantum well and a conduction quantum well between the first and second cladding layer, the valence quantum well having a valence energy difference $\Delta Ev$ being the difference between the cladding valence band energy and the emission valence band energy and the conduction quantum well having a conduction energy difference $\Delta Ec$ being the difference between the cladding conduction band energy and the emission conduction band energy,
wherein one of the following conditions are satisfied:
i. $Qc=\Delta Ec/(\Delta Ev+\Delta Ec)<0.25$ and $m_e/m_h<0.1$, where $m_e$ is the electron effective mass in the conduction band of the emission layer, $m_h$ is the hole effective mass in the valence band; or ii. $Qv=\Delta Ev/(\Delta Ev+\Delta Ec)<0.25$ and $m_h/m_e<0.1$, $m_e$ is the electron effective mass in the conduction band of the emission layer, $m_h$ is the hole effective mass in the valence band.

2. A LED, as in claim 1, where the first cladding layer is doped with a p-type carrier, the second cladding layer is doped with an n-type carrier, and the emission layer is undoped.

3. A LED, as in claim 2, where the p-type carrier dopant level is $1E17$ $cm^{-3}$ to $1E18$ $cm^{-3}$ and the n-type carrier dopant level is $1E17$ $cm^{-3}$ to $1E18$ $cm^{-3}$.

4. A LED, as in claim 1, where the first cladding layer has a first doped and a first undoped region, the first doped region being doped with a p-type carrier and the second cladding layer has a second doped and a second undoped region, the second doped region being doped with an n-type carrier, and the first and second undoped regions interface with the emission layer which is undoped.

5. A LED, as in claim 4, where the p-type carrier dopant level is $1E17$ $cm^{-3}$ to $1E18$ $cm^{-3}$ And the n-type carrier dopant level is $1E17$ $cm^{-3}$ to $1E18$ $cm^{-3}$.

6. A LED, as in claim 1, where an injection current below $200\mu$ amperes flows through the LED and the injection current is converted to electromagnetic radiation at an internal quantum efficiency greater than 80%.

7. A LED, as in claim 1, that has a cross sectional area of less than $3\times10^{-7}$ $m^2$.

8. A LED, as in claim 1, where the thickness of the emissions layer is between 7 to 10 nm.

9. A LED, as in claim 1, where the thickness of the first and second cladding layer is between 100 and 300 nm in thickness.

10. A LED, as in claim 1, where the valence quantum well has a potential depth over 3 times in absolute value the potential depth of the conduction quantum well.

11. A LED, as in claim 1, where the conduction quantum well has a potential depth over 3 times in absolute value the potential depth of the valence quantum well.

12. A LED, as in claim 1, where the first and second cladding layers are made of a material with an interface recombination velocity (IRV) under 1.5 cm/second.

13. A LED, as in claim 1, used in any one or more of the following devices: an optical communication device, a mote in the Internet of Things (IoT), a sensor, a device with no external power connection, a neuromorphic optical network with low power consumption, and an optogenetic device that needs to reduce heating for surrounding tissues.

14. A LED, as in claim 1, that communicates with a bit error rate below 1E-6 while operating below 100 µWatt with a communication distance of 5 cm.

15. A light emitting diode (LED) comprising:
    a first cladding layer made of $In_{0.49}Ga_{0.51}P$, the first cladding layer being between 100 nm and 300 nm thick;
    a second cladding layer made of $In_{0.49}Ga_{0.51}P$, the second cladding layer being between 100 nm and 300 nm thick;
    an emissions layer disposed between the first and second cladding layer, the emissions layer made from one of $In_{0.18}Ga_{0.82}As$ and GaAs, the emissions layer having a thickness of between 7 to 10 nm,
wherein a valence quantum well and a conduction quantum well form in the emission layer between the first and second cladding layer.

16. A LED, as in claim 15, operating with an injection current of below 1 µamp.

17. A LED, as in claim 15, where the first cladding layer is doped with a p-type carrier between $1E17$ $cm^{-3}$ and $1E18$ $cm^{-3}$, the second cladding layer is doped with an n-type carrier between $1E17$ $cm^{-3}$ and $1E18$ $cm^{-3}$, and the emission layer is undoped.

18. A LED, as in claim 15, where the first cladding layer has a first doped and a first undoped region, the first doped region being doped with a p-type carrier between $1E17$ $cm^{-3}$ and $1E18$ $cm^{-3}$ and the second cladding layer has a second doped and a second undoped region, the second doped region being doped with an n-type carrier between $1E17$ $cm^{-3}$ and $1E18$ $cm^{-3}$, and the first and second undoped regions interface with the emission layer which is undoped.

* * * * *